United States Patent [19]

Turek et al.

[11] Patent Number: 5,210,941

[45] Date of Patent: May 18, 1993

[54] METHOD FOR MAKING CIRCUIT BOARD HAVING A METAL SUPPORT

[75] Inventors: Joseph A. Turek, Downers Grove; Joel S. Dryer, Morton Grove, both of Ill.; Harold L. Sexson, Glendora, Calif.

[73] Assignee: Poly Circuits, Inc., Bensenville, Ill.

[21] Appl. No.: 732,665

[22] Filed: Jul. 19, 1991

[51] Int. Cl.⁵ .................................... H01K 3/10
[52] U.S. Cl. ........................ 29/852; 29/832; 29/840; 156/902; 428/901
[58] Field of Search ............... 156/901, 307.3; 29/832, 29/840, 852; 428/901

[56] References Cited

U.S. PATENT DOCUMENTS

| | | | |
|---|---|---|---|
| 4,294,009 | 10/1981 | Quintin et al. | 29/832 |
| 4,496,793 | 1/1985 | Hanson et al. | 428/901 X |
| 4,499,152 | 2/1985 | Green et al. | 428/901 X |
| 4,616,413 | 10/1986 | Ilrou et al. | 29/832 |
| 4,814,040 | 3/1989 | Ozawa | 156/902 X |

OTHER PUBLICATIONS

Technical Information Brochures from Dow Corning.
Brochure from Arlon disclosing adhesives for electronic materials.

Primary Examiner—Carl J. Arbes
Attorney, Agent, or Firm—Leydig, Voit & Mayer

[57] ABSTRACT

A double-sided printed circuit board and a method for making the circuit board. The circuit board includes a metal support that functions as both a heat sink and a ground plane. The circuit board contains a dielectric having first and second conductive foil platings on opposing sides of the dielectric. Prior to bonding the first foil plating to the metal support with a conductive adhesive, a standard protective coating on the first foil plating, which typically remains on the foil plating in conventional practice, is removed in order to expose a bare surface of the first foil plating. The exposed bare surface of the first foil plating is then bonded to the metal support before any substantial oxidation or a build up of impurities on the first foil plating surface can occur.

10 Claims, 5 Drawing Sheets

METHOD FOR MAKING CIRCUIT BOARD HAVING A METAL SUPPORT

FIELD OF THE INVENTION

The present invention relates generally to manufacturing a printed circuit board, and more particularly to constructing a printed circuit board including a metal support that functions as a ground plane or heat sink.

BACKGROUND OF THE INVENTION

Although conventional dielectrics used in manufacturing printed circuit boards, such as polytetrafluoroethylene (PTFE), are capable of tolerating high temperatures generated by high power and high wattage components, the generated heat must be dissipated in order to prevent the high temperatures from affecting the operation of the circuitry and possibly damaging the components or surrounding circuitry.

Initial attempts at solving this problem have resulted in designing pre-bonded metal-backed PTFE printed circuit boards. Metal-backed PTFE circuit boards began as a single-sided printed circuit board having a cladding or foil plating of conductive material, such as copper, on a front side of a dielectric and a metal backing or support on a backside of the dielectric. The metal backing was simply affixed to the backside of the dielectric material using a non-electrically conductive adhesive. The foil plating was patterned and etched to form printed wiring for securing electronic components, and the metal backing functioned as a heat sink.

Later attempts became more sophisticated and circuit boards were designed that incorporated electrically conductive or plated through holes (PTHs) that passed completely through the printed wire foil, the dielectric, and the metal backing, thus enabling the metal backing to function as a ground plane as well as a heat sink. Copper was the first metal used as a heat sink because of its compatibility with the plated through hole process. Aluminum was later used because of its ease in machining, lighter weight and lower cost. Aluminum now accounts for the majority of metal-backed PTFE circuit board designs, but the plating of aluminum backed PTFE circuit boards having plated through holes is generally a relatively expensive process.

A notorious problem associated with the pre-bonded metal-backed circuit board design is that the entire board must be processed as one assembly. Since the pre-bonded circuit board has plated through holes that extend completely through the thicknesses of the foil plating, the dielectric and the metal backing, these materials must first be bonded together before drilling holes in order to ensure that the plated through holes are correctly aligned. This construction method of the pre-bonded circuit board significantly limits the design options available to a design engineer because the dielectric and the printed wiring of the circuit board cannot be constructed independently from the metal backing. The metal backing must be permanently affixed to the dielectric during the initial construction of the circuit board, and thus be carried by the dielectric during the remainder of the circuit board construction procedure.

An alternative approach used to avoid the problems associated with pre-bonded circuit boards has been to build the circuit board separately from the metal backing as a double-sided board and then "sweat" the two together using solder paste. This attempted method, however, is very messy and the resulting bond is unreliable and tends to delaminate if subjected to vapor phase soldering and assembly.

A more recent attempt at designing a circuit board with a heat sink ground plane produces a double-sided PTFE circuit board having plated through holes extending through front and back foil platings on opposing sides of a dielectric. The back foil plating is coated in accordance with conventional procedure, and is configured to function as a ground plane. The coated back foil plating is then conductively bonded to a metal support or backing with a conductive adhesive. The conductive adhesive carries current to the metal support, or heat sink, in an attempt to eliminate the need for plated through holes in the heat sink.

While this design, at least in theory, appeared to provide a better alternative to some of the problems associated with prior attempts at designing a metal-backed circuit board, practical application of this design proved to create new problems. For example, in order to ensure the conductive quality of the foil plating used to form printed wiring, it is standard practice for all foil platings to be coated with a layer of protective material during production and prior to shipping. The coating is necessary in order to prevent a conductive foil plating, such as copper, from oxidizing or developing a film coating of impurities, thus becoming a less effective conductor than pure copper. The protective coating also functions to improve solderability of electronic components to the foil plating. The protective coating is typically a form of tin-lead that will melt when electronic components are soldered to the printed wiring of the circuit board.

As a result of the required protective coatings applied to the foil platings of circuit boards, the protective layer is positioned between the back foil plating and the conductive adhesive during the conductive bonding procedure. The presence of the protective coating being in contact with the conductive adhesive has negative effects on the quality of the finished circuit board. For example, the protective coating can melt, as it was designed to do, when exposed to heat, thus weakening or destroying the bond between the back foil plating and the metal support. Unfortunately, this exposure to heat occurs when the electronic components are being soldered to the front foil plating after the bonding procedure has been carried out. Furthermore, the protective coating can decrease the conductivity of the conductive bond by positioning a layer of less conductive material between the back foil plating and the metal support.

Commercially available plated dielectrics used in the production of circuit boards require the protective coatings in order to ensure the conductive quality of the platings, and the protective coatings cannot simply be removed without risking oxidation or the development of a film of impurities on the foil platings.

OBJECTS AND SUMMARY OF THE INVENTION

In view of the foregoing, it is a primary object of the present invention to provide a composite circuit board which is conductively bonded to a metal ground plane in a manner that maintains a highly effective bond even after exposure to soldering.

Briefly, the present invention provides a double-sided printed circuit board and a method for making the circuit board. The circuit board includes a metal support that functions as both a heat sink and a ground plane. The circuit board contains a dielectric having first and second conductive foil platings on opposing sides of the dielectric. Prior to bonding the first foil plating to the metal support with a conductive adhesive, a standard protective coating on the first foil plating, which typically remains on the foil plating in conventional practice, is removed in order to expose a bare surface of the first foil plating. The exposed bare surface of the first foil plating is then bonded to the metal support before any substantial oxidation or a build up of impurities on the first foil plating surface can occur.

Other objects and advantages of the invention will become apparent upon reading the attached detailed description and upon reference to the drawings.

BRIEF PRESCRIPTION OF THE DRAWINGS

While the invention will be described in connection with certain preferred embodiments, it will be understood that it is not intended to limit the invention to these particular embodiments. On the contrary, it is intended to cover all alternatives, modifications and equivalent arrangements as may be included within the spirit and scope of the invention.

DETAILED DESCRIPTION OF THE PREFERRED EMBODIMENTS

Figure 1:
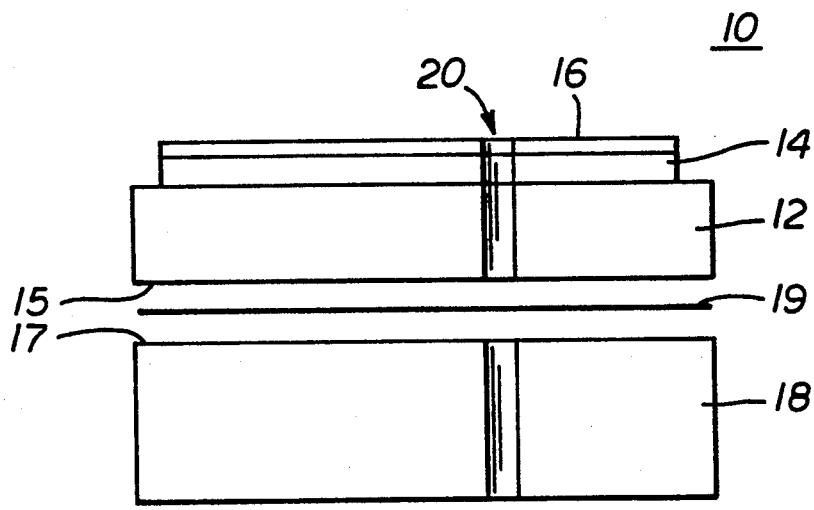
FIG. 1 is an exploded cross-sectional view of a printed circuit board constructed in accordance with a prior art design.

Turning now to the drawings, FIG. 1 illustrates a cross-sectional view of a circuit board 10 configured in accordance with a pre-bonding design of the prior art. The circuit board 10 includes a dielectric 12 having a foil plating 14 of conductive material, such as copper. The surface of the foil plating 14 has a standard coating 16 for protecting the foil plating 14 from oxidation and improving solderability of electronic components to the foil plating 14. A surface 15 of the dielectric 12 is bonded to a surface 17 of a metal backing, support or heat sink 18 using a non-electrically conductive adhesive 19. In order for the metal backing 18 to function as an electrical ground plane, at least one plated-through-hole (PTH) 20 must pass through the complete thicknesses of the protective coating 16, the foil plating 14, the dielectric 12, the non-conductive adhesive 19, and the metal support 18. In order for the PTH 20 to align correctly with the dielectric 12 and the metal backing 18, the PTH 20 must be drilled and plated after the dielectric 12 is bonded to the metal support 18.

Figure 2:
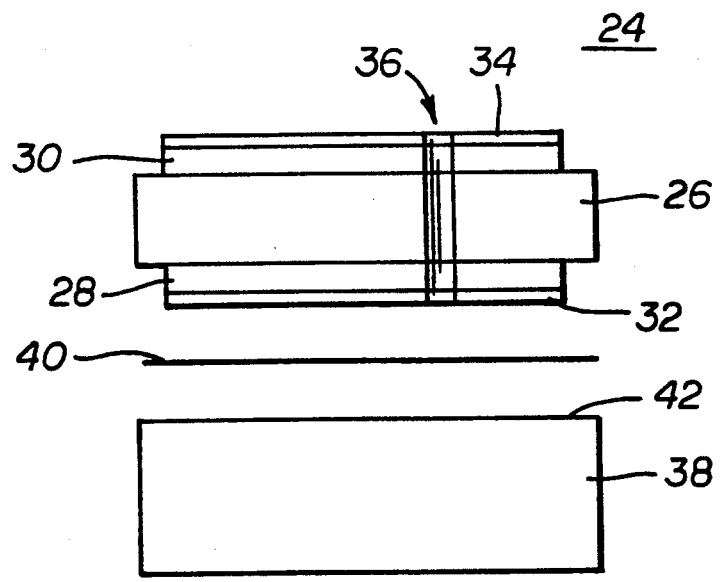
FIG. 2 is an exploded cross-sectional view of a printed circuit board constructed in accordance with another prior art design.

FIG. 2 illustrates an exploded cross-sectional view of a circuit board 24 configured in accordance with a design of the prior art. The circuit board 24 includes a dielectric 26, such as a flexible sheet polytetrafluoroethylene (PTFE). On opposing sides of the dielectric 26 are first and second foil platings 28, 30, respectively, of a conductive material, such as copper. The foil platings 28,30 are typically 0.7-2.8 millimeters thick. Standard layers of protective coatings 32,34 are on the surfaces of the first and second foil platings 28,30, respectively. A plated through hole (PTH) 36 is shown passing through the complete thicknesses of both protective coatings 32,34, both foil platings 28,30 and the dielectric 26.

A metal support or heat sink 38 is shown adjacent to the protective coating 32 of the first foil plating 28. Intermediate the metal support 38 and the protective coating 32 is a conductive adhesive 40. The conductive adhesive 40 is preferably in sheet form. The protective coating 32 of the first foil plating surface 28 is conductively bonded to the metal support 38 by positioning the sheet of conductive adhesive 40 between a surface 42 of the metal support 38 and the protective coating 32.

After the dielectric 26 is bonded to the metal support 38, the protective coating 32 forms a heat sensitive layer separating the conductive adhesive 40 from direct contact with the first foil plating 28. As a result of this configuration, the resulting bond can be weakened or broken when the circuit board 24 is exposed to heat, such as when electronic components are being soldered to the second foil plating 30.

In accordance with the present invention, a circuit board is provided having a metal support that functions both as an effective heat sink and a highly conductive ground plane, wherein structural and conductive integrity of the board is maintained when the board is subjected to high temperatures, such as during soldering electronic components to the circuit board.

Figure 3:
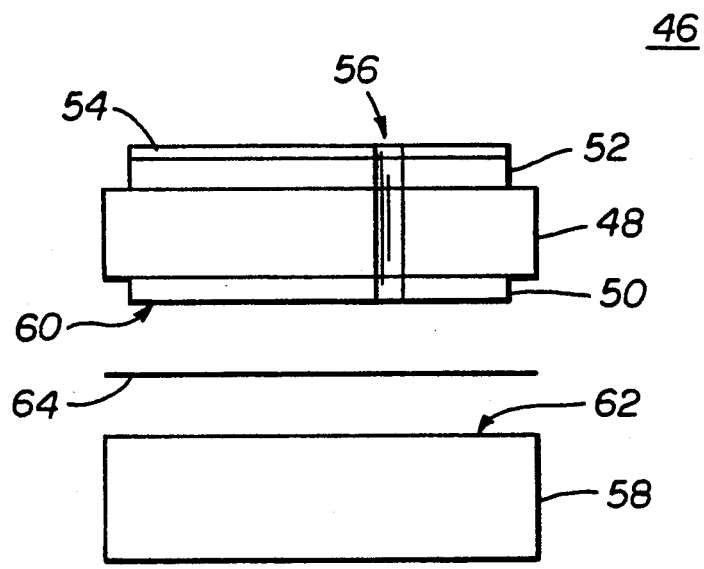
FIG. 3 is an exploded, cross-sectional view of a printed circuit board configured in accordance with the present invention.

FIG. 3 illustrates a circuit board 46 configured in accordance with the present invention. The circuit board 46 includes a dielectric 48 having first and second foil platings 50,52, respectively, of conductive material on opposing sides of the dielectric 48. The foil platings 50,52 are the primary metal conductors that are securely bonded to the surface of the dielectric 48 and patterned to form printed wiring for electrically connecting electronic components that are to be mounted to the circuit board 46. The foil platings, or foils, are typically made from a highly effective conductor, such as copper. A coating of protective material 54 is on the surface of the second foil plating 52. The coating 54 is applied over the foil 52 in order to protect the foil plating 52 and also to mechanically fix electronic components to the foil 52 during soldering procedures. A plated through hole (PTH) 56 passes through the complete thicknesses of the protective coating 54, both foil platings 50,52, and the dielectric 48. A metal support or heat sink 58 is adjacent to an exposed, bare surface 60 of the first foil plating 50. The bare surface 60 lacks any protective coating. Intermittent a surface 62 of the metal support 58 and the bare surface 60 is an electrically conductive adhesive 64.

In accordance with the present invention, the bare surface 60 of the first foil plating 50 is conductively bonded to the surface 62 of the metal support 58 with a conductive adhesive 64 before any substantial oxidation can occur on the first foil plating surface 60. By conductively bonding the bare surface 60 of the first foil plating 50 to the metal support surface 62, there is no protective coating present between the first foil plating surface 60 and the conductive adhesive 64 that can melt when the circuit board 46 is exposed to heat, such as during soldering, and thus weaken or break the conductive bond between the first foil plating 50 and the metal support 58. Furthermore, by eliminating any coating from the surface 60 of the first foil plating 50, which is conventionally present on the first foil plating surface 60, the conductivity between the first foil plating 60 and the metal support 58 is improved because a coating of protective material is typically less conductive than the first foil plating 50.

The first foil plating surface 60 is treated immediately prior to being bonded to the metal support surface 62 in order to remove any coating from the surface 60 and thereby expose the bare, conductive material of the first foil plating 50. If the protective coating is formed from solder, then the protective coating is removed from the first foil plating surface 60 by any conventional method for removing solder. Typically, the bonding process must occur within 30 minutes after the bare surface 60 is exposed in order to prevent any oxidation from occurring on the first foil plating surface 60.

The surfaces 60 and 62 of the first foil plating 50 and the metal support 58, respectively, are configured to substantially conform to each other so that a secure bond can be created between the surfaces 60 and 62. Typically, the surfaces 60 and 62 are planar.

Figure 4:
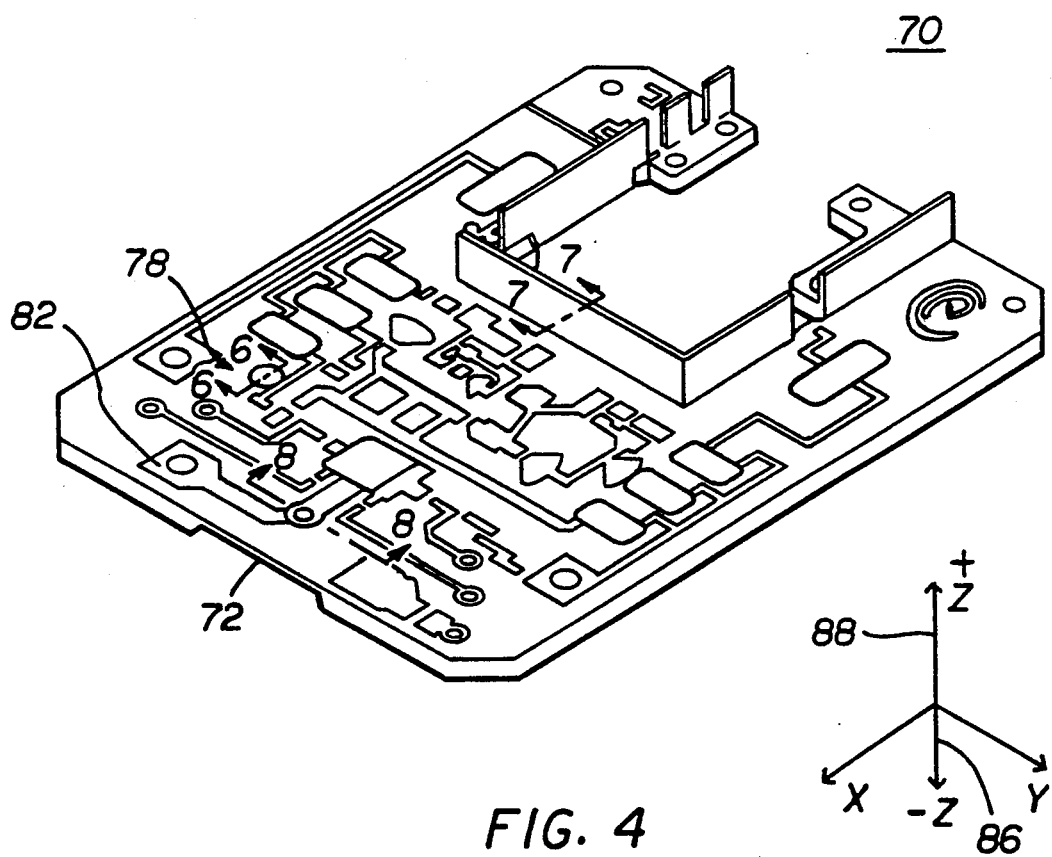
FIG. 4 is a perspective view of a more detailed circuit board configured in accordance with the present invention.
Figure 5:
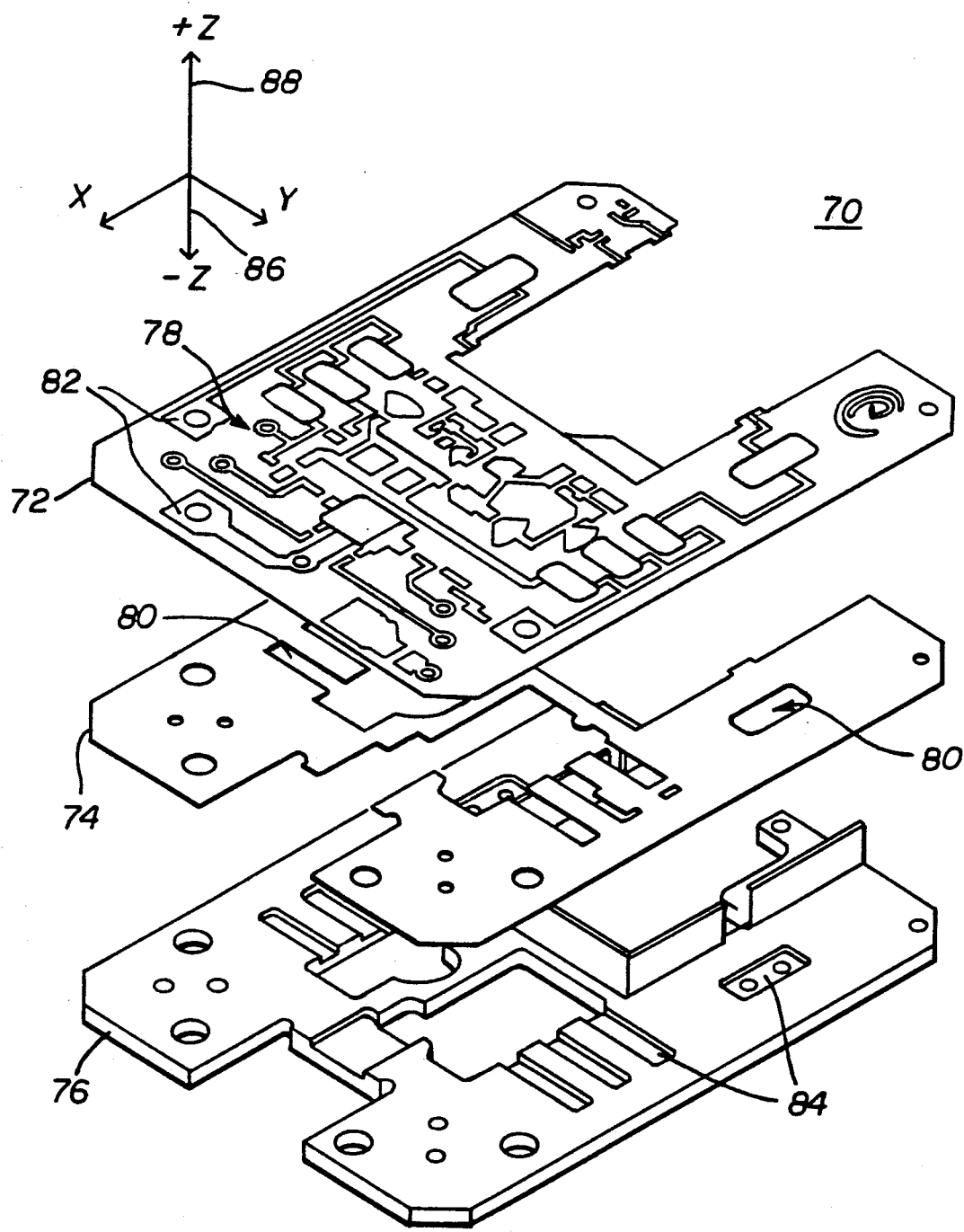
FIG. 5 is an exploded perspective view of the circuit board shown in FIG. 4.

FIG. 4 is a perspective view of a more detailed circuit board 70 configured in accordance with the present invention. FIG. 5 provides an exploded perspective view of the circuit board 70 which includes a dielectric 72, a conductive adhesive 74, a metal support 76, and PTHs 78. The conductive adhesive 74 is preferably in sheet form in order to facilitate handling, and further, to provide additional liberty in design options. For example, as can be seen in FIG. 5 the conductive adhesive sheet 74 includes various holes or slits 80 that function to prevent predetermined portions of foil plating 82 (on both sides of the dielectric 72) from being in electrical contact with the metal support 76, i.e., ground.

Furthermore, since the PTHs 78 in the conductive bonding process are not required to extend through the metal support 76, the dielectric 72 and the metal support 76 can be constructed independently before being bonded together. This independent construction of parts provides numerous advantages. For example, a designer is free to create three dimensional features 84 on the metal support 76 which can be both in a negative-Z axis 86 (indentions, pockets, channels, countersinks, counter bores, and tapped holes) and the positive Z-axis 88 (walls, isolation areas, post and raised features). The foil plating 82 of the dielectric 72 can even be bonded to finned extrusions of the metal support 76. The configuration of the present invention does not limit a designer to a flat heat sink design, and the possibility of damage to the circuit during the heat sink machining stage is substantially reduced by separating the metal support 76 (heat sink) from the dielectric 72 during independent construction of those parts. Moreover, the independent construction of the dielectric 72 and the metal support 76 provides access to both sides of the dielectric 72 during drilling and other constructive operations to the circuit board 70.

Figure 6:
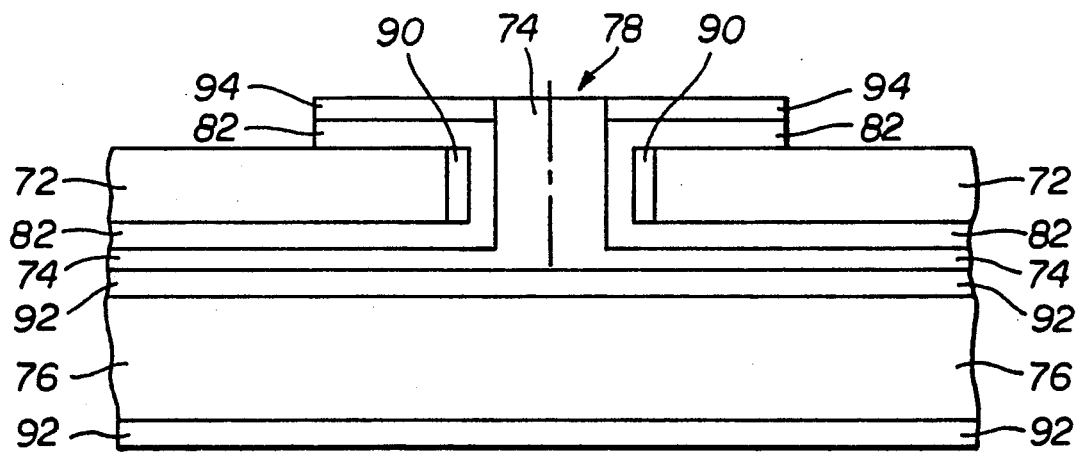
FIG. 6 is a cross-sectional view of the circuit board shown in and taken along line 6—6 of FIG. 4.
Figure 7:
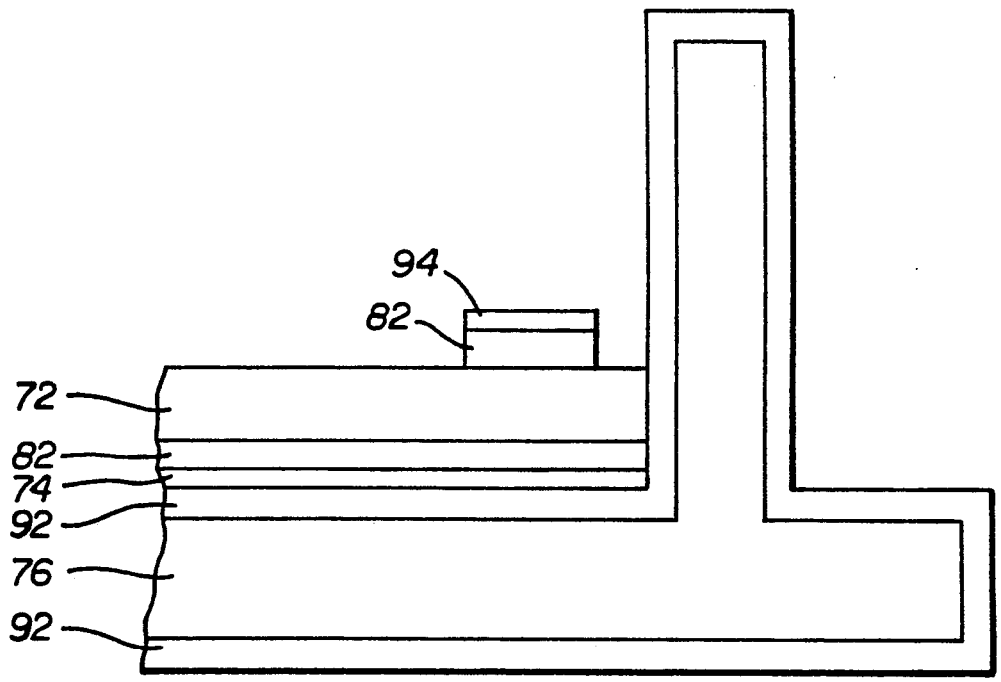
FIG. 7 is a cross-sectional view of the circuit board shown in and taken along line 7—7 of FIG. 4.
Figure 8:
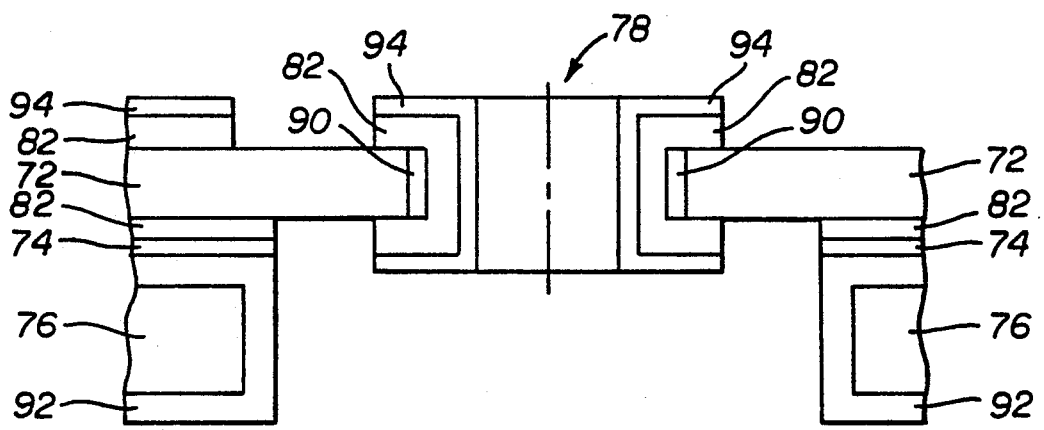
FIG. 8 is a cross-sectional view of the circuit board shown in and taken along line 8—8 of FIG. 4.

FIGS. 6-8 are cross-sectional views of the circuit board 70 shown in FIG. 4. FIGS. 6-8 show cross-sections of the dielectric 72, the conductive adhesive sheet 74, the metal support 76, the foil platings 82, and PTHs 78. Electroless plating 90 is applied to the PTHs 78 after drilling in order to enable conductive material or foil plating to affix to the PTHs 78 of the dielectric 72. These figures further illustrate additional materials that can also be included in the circuit board 70, such as a conventional metal support finish 92 and a conventional circuit metal finish 94 which are applied to the circuit board at the final stage of construction. Neither finish 92 or 94 interfere with the conductive bond formed between the foil plating 82 and the metal support 76.

FIG. 6 also illustrates an important aspect of the invention. One annoying problem with heat sink designs is that the solder used for component mounting flows into the plated through holes 78 during the soldering process which makes soldering difficult and costly, and further leaves a potential field failure problem if undetected. The bonding approach utilized by the present invention, however, solves this problem. During the bonding process, the viscosity of the conductive adhesive 74 decreases, thus enabling the conductive adhesive 74 to fill the PTHs 78. Filling the PTHs 78 with the conductive adhesive 78 serves to strengthen the bond between the dielectric 72 and the metal support 76, and further, prevents solder from filling the PTHs 78 when electronic components are being soldered to the circuit board 70.

In accordance with the present invention, a method is provided for making a double-sided printed circuit board having a metal support that functions both as an effective heat sink and a highly conductive ground plane, wherein the structural and conductive integrity of the board is maintained when the board is subjected to high temperatures, such as soldering electronic components to the circuit board.

The following is a commercially viable step-by-step procedure that may be followed in manufacturing the present invention. Of specific importance is step 10 in part A, wherein the protective coating is removed from the first or bottom foil plating prior to the conductive bonding process. Since other steps of this example procedure are conventional and understood by those skilled in the art, these remaining steps will not be discussed in detail.

A. FABRICATE CIRCUIT BOARD FROM DOUBLE SIDED COPPER CLAD LAMINATE MATERIAL

1. Drill plated through holes in dielectric
2. Sensitize through holes to accept electroless plating
3. Electroless plate through holes to make them electrically conductive
4. Image dielectric to define circuit patterns
5. Electrolytically plate dielectric with copper
6. Electrolytically plate dielectric with specified metal finish, i.e., tin, tin/lead, gold, etc.
7. Remove imaging material exposing copper cladding
8. exposed copper down to laminate material
9. Mask top side of dielectric, protecting circuitry
10. Strip finishing metal off bottom side of dielectric down to copper layer
11. Machine board to specified dimensions
12. Hold for bonding stage

B. FABRICATE METAL BACKING MATERIAL

1. Machine metal part to final dimensions
2. Plate metal surfaces with specified finish, i.e., tin, nickel, gold, alodine, brush clean, etc.
3. Hold for bonding stage

C. BONDING CIRCUIT BOARD TO METAL BACKING

1. Prepare and clean all surfaces that will be bonded. Wash in acetone, air dry, coat each surface with primer, and air dry.
2. Lay conductive silicone adhesive on metal surface
3. Lay circuit board on adhesive forming a layered package
4. Place package between two heavy metal plates forming a book
5. Place book in an oven at specified time and temperature to thoroughly cure the silicone adhesive
6. Cool package to room temperature, separate from plates, trim flashing and clean as needed
7. Process complete A conductive bonding adhesive used by the Applicants in developing the present invention is produced by Silicone Rubber Specialties (SRS), a division of Arlon, which at the time of filing this application has a published address of 9433 Hyssop Drive, Rancho Cucamonga, Calif. 91730. The conductive adhesive is a silicone or fluorosilicone based product impregnated with silver, aluminum or nickel. Arlon's line of conductive adhesives include four distinct products: SRS101, SRS102, SRS103, and SRS104. These silicone based adhesives employ a low temperature curing system (250° F.). The conductive adhesive 74 used in bonding the dielectric 72 to the metal support 76 bonds or cures at a relatively low temperature of 250° F. and does not melt after curing when exposed to higher temperatures (about 500° F.) necessary for soldering electronic components to the circuit board 70. This feature enables the electronic components to be soldered to the circuit board 70 either before or after the bonding process without causing reflow of the conductive adhesive 74. These conductive adhesives can also be handled at room temperature in sheet form and exhibit low flow during bonding which facilitates assembly and clean up of the circuit boards 70. The conductive adhesives also provide very strong bonds between any treated metal surfaces.

In developing the present invention, Applicants developed their own conductive adhesive in order to improve bonding strength and further protect the exposed foil plating from oxidizing without decreasing conductivity or flexibility of the adhesive during the bonding procedure. The developed conductive adhesive provides additional adhesion for improved bonding strength and increases conductivity without higher loading of conductive filler which decreases tearing when processing and applying the conductive adhesive. The preferred conductive adhesive is set forth below. It can be made by conventional processing techniques.

| Component | Parts by Weight |
| --- | --- |
| Silicone heat curable rubber | 100 |
| Filler dispersant | 1 ± 0.1 |
| Heat stabilizer | 1 ± 0.1 |
| Anti-oxidizer | 0.3 ± 0.1 |
| Peroxide catalyst (cure) | 1 ± 0.1 |
| Adhesive promoter | 0.5 ± 0.1 |

-continued

| Component | Parts by Weight |
| --- | --- |
| Conductive filler | 300 ± 5 |

The silicone heat curable rubber preferably is phenyl-based silicone polymer having a durometer of 50 according to ASTM standards or a divinyl-based silicone polymer having a durometer of 25 according to ASTM standards. The silicone heat curable rubber can also be a methyl vinyl polysiloxane elastic polymer. The filler powder is a conductive filler selected from the group consisting of silver, silver graphite and silver aluminum. The filler powder enables the conductive adhesive to be electrically conductive. The adhesive promoter functions to increase the bonding strength of the conductive adhesive. The adhesive promoter comprises at least one of and preferably both Z-6030 TM (an organofunctional silane, namely, A-methacryloxypropyltrimethoxysilane) manufactured by Dow Corning, and KZ-TPP TM which is manufactured by Kenrich Chemical, Bayonne, N.J. KZ-TPP TM is Zirconium IV: 2-ethyl, 2-propenolatomethyl 1, 3-propanediolato, cyclo di 2, 2-(bis 2-propenolatomethyl) butanolato pyrophospato-0,0.

The heat stabilizer additive functions to prevent break up of the conductive adhesive when exposed to high temperatures. One commercially available heat stabilizer available for use in the novel composition is Silastic ® HT-1 Modifier which is manufactured by Dow Corning STI. Silastic H7-1 is a heat stability additive recommended for addition to silastic silicone rubber formulations. The peroxide catalyst controls the curing temperature of the adhesive which enables the conductive adhesive to cure at a temperature between 250°–320° F. The conductive adhesive is capable of withstanding soldering temperatures up to 500° F. without melting.

The anti-oxidizer is preferably used to inhibit oxidation of the conductive foil which is bonded to the metal backing by the conductive adhesive. Magnesium oxide is the preferred anti-oxidizer.

The filler dispersant prevents the filler powder from clumping up and enables the conductive filler, which is typically a powder, to evenly mix throughout the silicone heat curable rubber during manufacture of the conductive adhesive. A preferred filler dispersant is Silbond 40 TM, a polysiloxane coupling agent manufactured by Hüls America, Piscataway, N.J.

The ability of the conductive adhesive to conduct both electrically and thermally makes the conductive adhesive ideally suited for circuit board design. As a thermal conductor, the adhesive 74 enables the metal support 76 to efficiently carry away heat from electronic components mounted to the circuit board 70. The conductive bonding approach enables heat to be conducted better than an identical design using pre-bonded materials.

Figure 9:
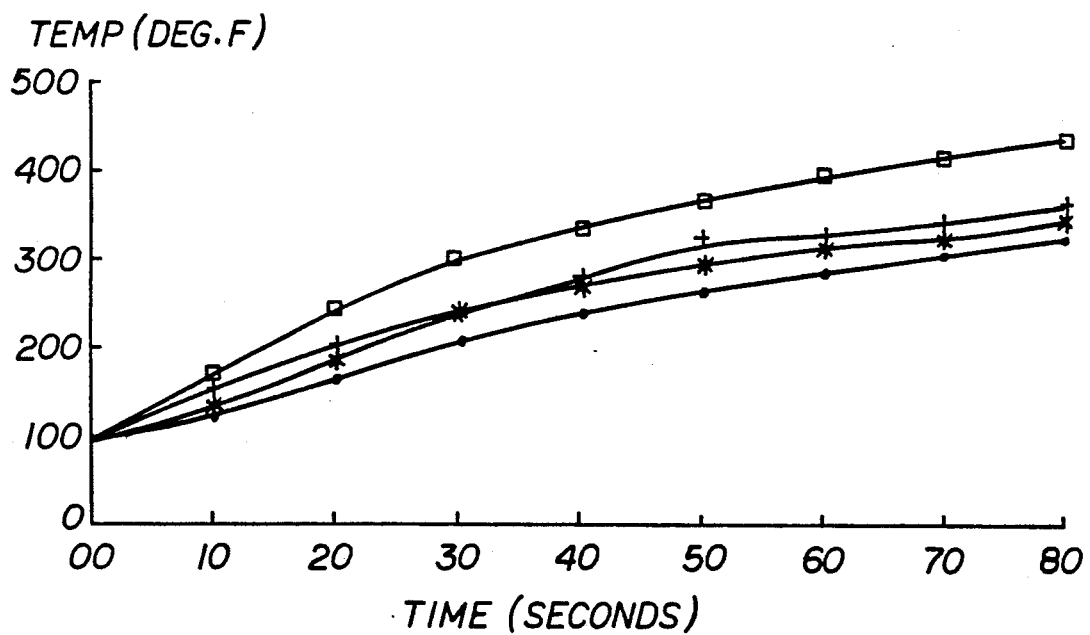
FIG. 9 is a graph illustrating a comparison of thermal rise among various circuit board configurations and materials.

FIG. 9 is a graph illustrating how effective different circuit board materials and configurations are at conducting heat generated by electronic components of a circuit board to an attached heat sink. FIG. 9 plots the temperature verses time conductivity response of four different circuit board configurations: 1) pre-bond, 2) tin plating conductive bond, 3) solder plating conductive bond, and 4) copper plating conductive bond. As can clearly be seen from the plots of FIG. 9, a copper plated, conductively bonded circuit board is the most effective of the four configurations at conducting generated heat away for the electronic components.

The improved conductivity of heat provided by copper plated conductively bonded circuit boards emphasizes the importance of increased heat tolerances on the bond between the first foil plating 50 and the metal support 58 (FIG. 3), and the present invention is specifically designed to satisfy such heat tolerance demands and to improve both heat and electrical conductivity of the conductive bond. By removing the protective coating from the first foil plating surface 60 prior to the bonding process, the surface 60 is positioned in direct contact with the conductive adhesive 64, thus improving both the electrical and thermal conductivity of the circuit board 46.

Differences in coefficient of thermal expansions (CTE) between PTFE and various metals are very significant. Adhesives used in pre-bonded material have a CTE similar to PTFE and may delaminate under thermal stress. The conductive bonding process of the present invention uses the conductive adhesives which act to decouple these dissimilarities, thus reducing stress and preventing delamination.

Metals in the pre-bonded material must also undergo 750° F. for one hour during the lamination process. This reduces the hardness of treated materials, especially aluminum. The lower cure temperature used in the conductive bonding process of the present invention (250° F.) and a short bond cycle (15 minutes) have minimal affects on the metal hardness of the heat sink or metal support 76.

The use of a copper ground plane on the backside of the PTFE circuit board prior to conductive bonding has two advantages: 1) copper is a better conductor than aluminum when acting as a ground plane, and 2) there is no layer of a different dielectric constant, as in the pre-bonded process, between the circuit side and the ground plane of the PTFE. The adhesive used in pre-bonded materials can be 1 or 2 thousands of an inch thick, which is significant when the PTFE thickness drops below 0.020 inches. The conductive bonding approach eliminates the dielectric difference as a potential problem.

Structural reliability of the plated through hole has a key advantage in the conductive bonding process of the present invention. Plated through holes in heat sinks are usually very small and this creates plating aspect ratios usually above 4:1 which are prone to inferior hole wall plating. With the conductive bonding approach of the present invention, double-sided circuit design is possible by creating open areas, pockets or channels in heat sink prior to the bonding process. The conductive adhesive 74 is then cut to match the machined heat sink 76.

We claim as our invention:

1. A method for manufacturing a circuit board having a metal support, the circuit board including a dielectric having a first and a second conductive foil affixed to opposing sides of the dielectric, said method comprising the steps of:

forming a plurality of plated through holes in the circuit board;

positioning an electrically conductive silicone adhesive between a surface of the first foil and a surface of the metal support, the first foil surface being exposed and free of any coating material, and the first foil surface being configured to substantially conform to the metal support surface; and bonding the exposed first foil surface to the metal support surface utilizing the electrically conductive adhesive, wherein the bonding step functions to cover and protect the exposed surface of the first foil and provide a highly conductive bond between the metal support and the first foil.

2. The method for manufacturing a circuit board as set forth in claim 1, wherein the step of forming the plated through holes comprises:

(a) drilling holes substantially perpendicular to the dielectric that pass through the dielectric and the foils; and (b) plating the drilled holes with a conductive material.

3. The method for manufacturing a circuit board as set forth in claim 1, wherein the first and second foils are prone to oxidize within a relatively short period of time when exposed to an oxygen environment, said method further comprising the step of:

cleaning the first foil surface before the bonding step in order to remove any coating material and expose a bare surface of the first foil, and the bonding step occurs before any substantial oxidation occurs on the bare surface of the first foil.

4. The method for manufacturing a circuit board as set forth in claim 1, wherein electronic components are to be electrically mounted to the second foil utilizing a bonding material that melts at a given temperature, and the conductive silicone adhesive provides a secure but flexible conductive bond between the first foil and the metal support while tolerating temperatures above the given temperature required to melt the bonding material for mounting the electronic components.

5. The method for manufacturing a circuit board as set forth in claim 1, further comprising the step of:

cleaning the metal support surface before the bonding step in order to expose a bare surface of the metal support.

6. The method for manufacturing a circuit board as set forth in claim 1, wherein the conductive adhesive is a heat activated silicone bonding material, and the bonding step includes curling the conductive silicone adhesive.

7. The method for manufacturing a circuit board as set forth in claim 1, wherein the conductive silicone adhesive is in sheet form.

8. The method for manufacturing a circuit board as set forth in claim 7, wherein the sheet of conductive silicone adhesive includes apertures, thereby preventing passage of electrical current between predetermined portions of the first foil surface and the metal support surface.

9. The method for manufacturing a circuit board as set forth in claim 1, wherein the surfaces of the first foil and the metal support are substantially planar.

10. The method for manufacturing a circuit board as set forth in claim 1 wherein the foils are covered with a protective solder coating, and the process includes stripping the protective solder coating from the first foil surface prior to bonding said first foil surface to the metal support.

* * * * *